United States Patent
Kelly et al.

(10) Patent No.: US 10,656,183 B2
(45) Date of Patent: May 19, 2020

(54) ENABLING A TRIGGER IN A TEST AND MEASUREMENT INSTRUMENT

(71) Applicant: Tektronix, Inc., Beaverton, OR (US)

(72) Inventors: David L. Kelly, Portland, OR (US);
Jed H. Andrews, Aloha, OR (US);
Patrick A. Smith, Beaverton, OR (US);
Michael A. Martin, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 253 days.

(21) Appl. No.: 15/796,722

(22) Filed: Oct. 27, 2017

(65) Prior Publication Data

US 2018/0372780 A1 Dec. 27, 2018

Related U.S. Application Data

(60) Provisional application No. 62/523,205, filed on Jun. 21, 2017.

(51) Int. Cl.
*G01R 13/02* (2006.01)
*G01R 19/00* (2006.01)
(Continued)

(52) U.S. Cl.
CPC ......... *G01R 13/0254* (2013.01); *G01R 13/32* (2013.01); *G01R 19/00* (2013.01); *G01R 27/28* (2013.01); *G01R 27/00* (2013.01)

(58) Field of Classification Search
CPC .... G01R 13/00; G01R 13/02; G01R 13/0218; G01R 13/0254; G01R 13/20; G01R 13/22;
(Continued)

(56) References Cited

U.S. PATENT DOCUMENTS 6,748,335 B2 * 6/2004 Pickerd ............... G01R 13/029
702/66
7,480,839 B2 * 1/2009 Smith ............... G01R 13/0254
324/76.11
(Continued)

FOREIGN PATENT DOCUMENTS

EP 1798562 6/2007
EP 2690449 1/2014

OTHER PUBLICATIONS

European Patent Office, Extended European Search Report and Written Opinion for European Patent Application 18179159.1, dated Dec. 12, 2018, 7 pages, Munich, Germany.

*Primary Examiner* — Hoai-An D. Nguyen
(74) *Attorney, Agent, or Firm* — Miller Nash Graham & Dunn; Andrew J. Harrington

(57) ABSTRACT

A test and measurement instrument, such as an oscilloscope, including one or more ports to receive one or more signals from a device under test, a trigger enable logic circuit configured to output a trigger enabled signal when a trigger enable event occurs within the one or more signals, the trigger enable event being a real-time event of the one or more signals, one or more trigger logic circuits configured to generate a plurality of trigger signals when the trigger enable signal is received, each trigger signal being generated when a trigger event occurs within one of the one or more signals, and an acquisition circuit configured to acquire and store data in a memory in response to each of the trigger signals.

20 Claims, 7 Drawing Sheets

(51) Int. Cl.
*G01R 27/28* (2006.01)
*G01R 13/32* (2006.01)
*G01R 27/00* (2006.01)

(58) Field of Classification Search
CPC ........ G01R 13/32; G01R 27/00; G01R 27/28; G01R 19/00
USPC .... 324/76.11, 76.12, 76.19, 76.22, 500, 537, 324/555, 600, 602, 603, 605, 606, 649, 324/650
See application file for complete search history.

(56) References Cited

U.S. PATENT DOCUMENTS

| | | | |
|---|---|---|---|
| 9,291,646 B2* | 3/2016 | Dobyns | G01R 13/0254 |
| 2004/0119620 A1 | 6/2004 | Tran et al. | |
| 2005/0021255 A1 | 1/2005 | Ramesh et al. | |
| 2012/0039378 A1* | 2/2012 | Nakayama | H02M 3/337 |
| | | | 375/226 |
| 2012/0105405 A1* | 5/2012 | Hsiao | G06F 1/3265 |
| | | | 345/208 |

* cited by examiner

ENABLING A TRIGGER IN A TEST AND MEASUREMENT INSTRUMENT

PRIORITY

This disclosure claims benefit of U.S. Provisional Application No. 62/523,205, titled "ARMING A TRIGGER IN A TEST AND MEASUREMENT INSTRUMENT," filed on Jun. 21, 2017, which is incorporated herein by reference in its entirety.

FIELD OF THE INVENTION

This disclosure is directed to systems and methods related to test and measurement systems, and in particular, to triggering a test and measurement instrument such as an oscilloscope.

BACKGROUND

Test and measurement instruments, such as an oscilloscope, can capture portions of a waveform, or other data, when certain events occur, which is referred to as triggering. The test and measurement instruments, however, must be put into a triggering state to begin triggering on an event. The triggering event may be an event occurring in a signal-under-test (SUT) from a device-under-test (DUT), or the event may be an event occurring in another signal. State of the art real-time oscilloscopes typically include manually selecting a user-interface (UI) control, pushing a physical button, or sending a programmable interface (PI) command from a control computer, to begin triggering. Once placed in a triggering state, various oscilloscope trigger methods may then capture digitized waveforms representing the signals-under-test. The trigger methods may be simple (Edge, Glitch, Pulse-Width, etc.) or complex A-to-B sequence triggers, e.g., Edge followed by Pulse Width after a certain time or number of B-Events. Additional trigger qualifications such as Reset Events or Logic Qualification Events may apply. However, these trigger methods only capture waveforms after the oscilloscope is in a triggering state.

Manually setting the oscilloscope in a trigger state may be ineffective because the manual input is unrelated to real-time events occurring in the signals-under-test, resulting in crude selectivity of captured waveforms. Setting oscilloscopes in a trigger state by PI commands may also be ineffective for the same reasons, or because the computer-to-scope communication channel is too slow to selectively capture real-time signal events of interest. Furthermore, complex trigger methods alone may not be selective enough to capture events of interest.

This disclosure addresses these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

In general, embodiments of the disclosure allow a user to define, or select, a trigger enable event, which is a real-time event on a received signal. When an instrument detects the trigger enable event on the received signal, the instrument enables the trigger system to trigger using an available triggering mode. This may also be referred to herein as an arming event to arm the oscilloscope, a hold-off event prior to triggering, and/or an initialization event to initialize the trigger. In the case of an A-to-B sequence trigger, the trigger enable event may be thought of, and treated as, a "pre-A-Event" to be followed by a full A-to-B-event sequence trigger, with or without Reset-Events. This approach maintains the full A-to-B sequence trigger capabilities, but also allows such capabilities to be enabled based on a real-time event on a signal. That is, the trigger enabled state persists across one or more trigger acquisitions of a SUT. Software, another signal, or a timeout event can reset the trigger enabled state.

Figure 1:
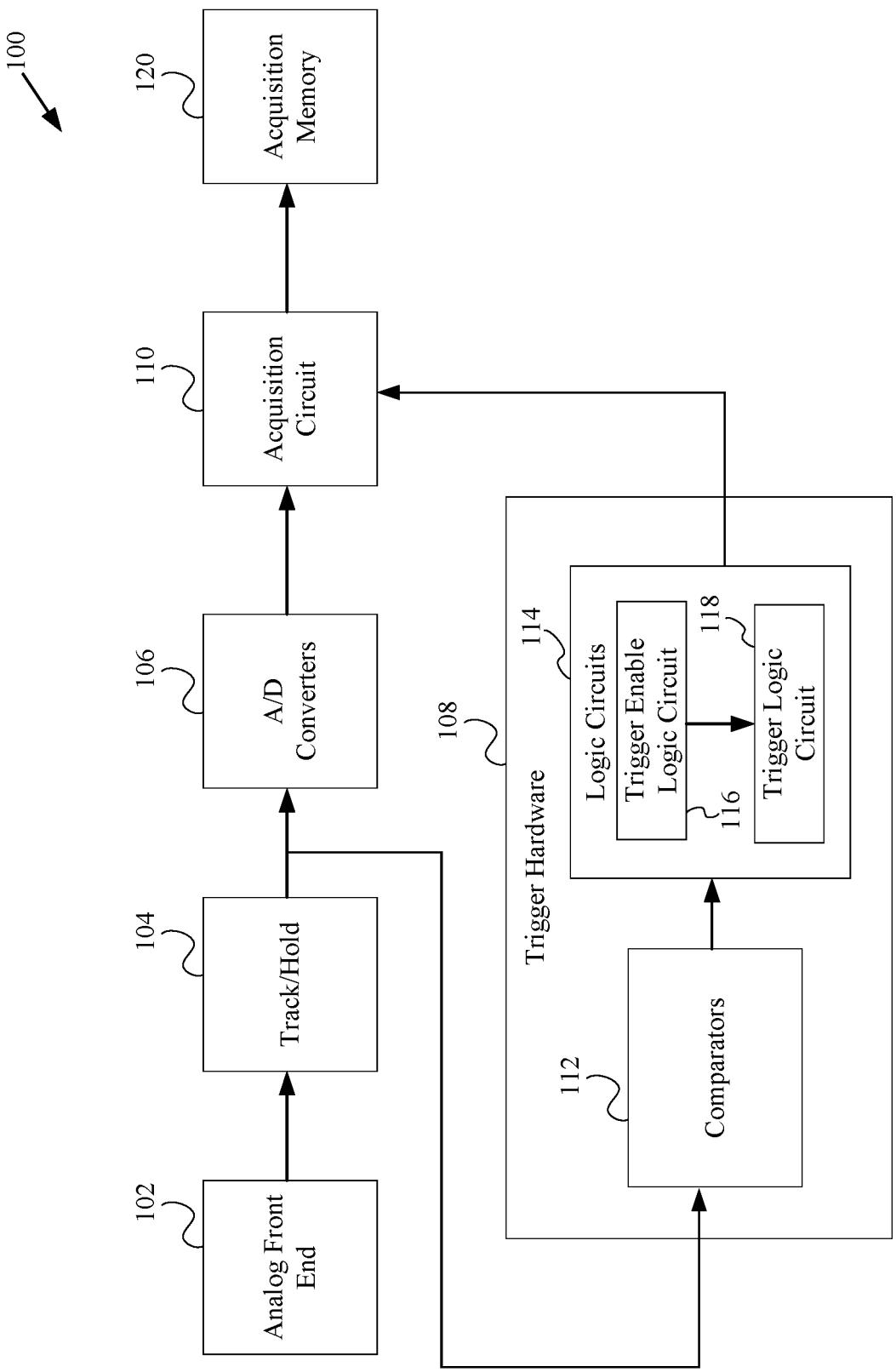
FIG. 1 is a block diagram of an example oscilloscope according to some embodiments of the disclosure.

FIG. 1 is a block diagram of an oscilloscope 100 according to some embodiments of the present disclosure. As understood by one skilled in the art, the oscilloscope 100 may include additional components not shown. The oscilloscope 100 includes an analog front end 102 to receive one or more analog signals from one or more devices, at least one of which is a device under test. The analog signals are received at a track-and-hold circuit 104, which tracks the one or more analog signals and holds samples of the one or more analog signals in response to a sample clock (not shown). The held samples of the track-and-hold circuit 104 are sent to an analog-to-digital converter (ADC) 106 as well as trigger hardware 108. The digitized samples are sent from the ADC 106 to an acquisition circuit 110.

Trigger hardware 108 includes comparators 112 and logic circuits 114. The comparators 112 output signals upon detection of a predetermined event on the one or more signals, which are sent to logic circuits 114. The predetermined events determined by comparators 112 may be events on a single analog signal or may include predetermined events on a combination of analog signals. The predetermined events are triggers that have been selected or defined by a user. The comparators 112 compare each of the received signals with a plurality of predetermined events. If an event is detected, the event signal is sent to the logic circuits 114.

The logic circuits 114 include, among other components not shown, a trigger enable logic circuit 116 and a trigger logic circuit 118. The trigger enable logic circuit 116 may include components that determine, based on a signal from the comparators 112, whether a trigger enable event has occurred on one of the one or more analog signals. If the trigger enable event has occurred, then the trigger logic circuit 118 is enabled and the trigger logic circuit 118 sends a trigger signal to the acquisition circuit 110 upon detection of one or more triggering events. The acquisition circuit 110 acquires a sequence of samples which may represent the digitized waveform in response to each trigger signal received from the trigger logic circuit 118 and stores the acquired portion in an acquisition memory 120 for either further processing or display. In some embodiments, the acquisition circuit 110 acquires other data instead of, or in addition to, the portion of one of the one or more triggering events. For example, the data may include a timestamp, an error rate, a frequency, or other derived data.

Figure 2:
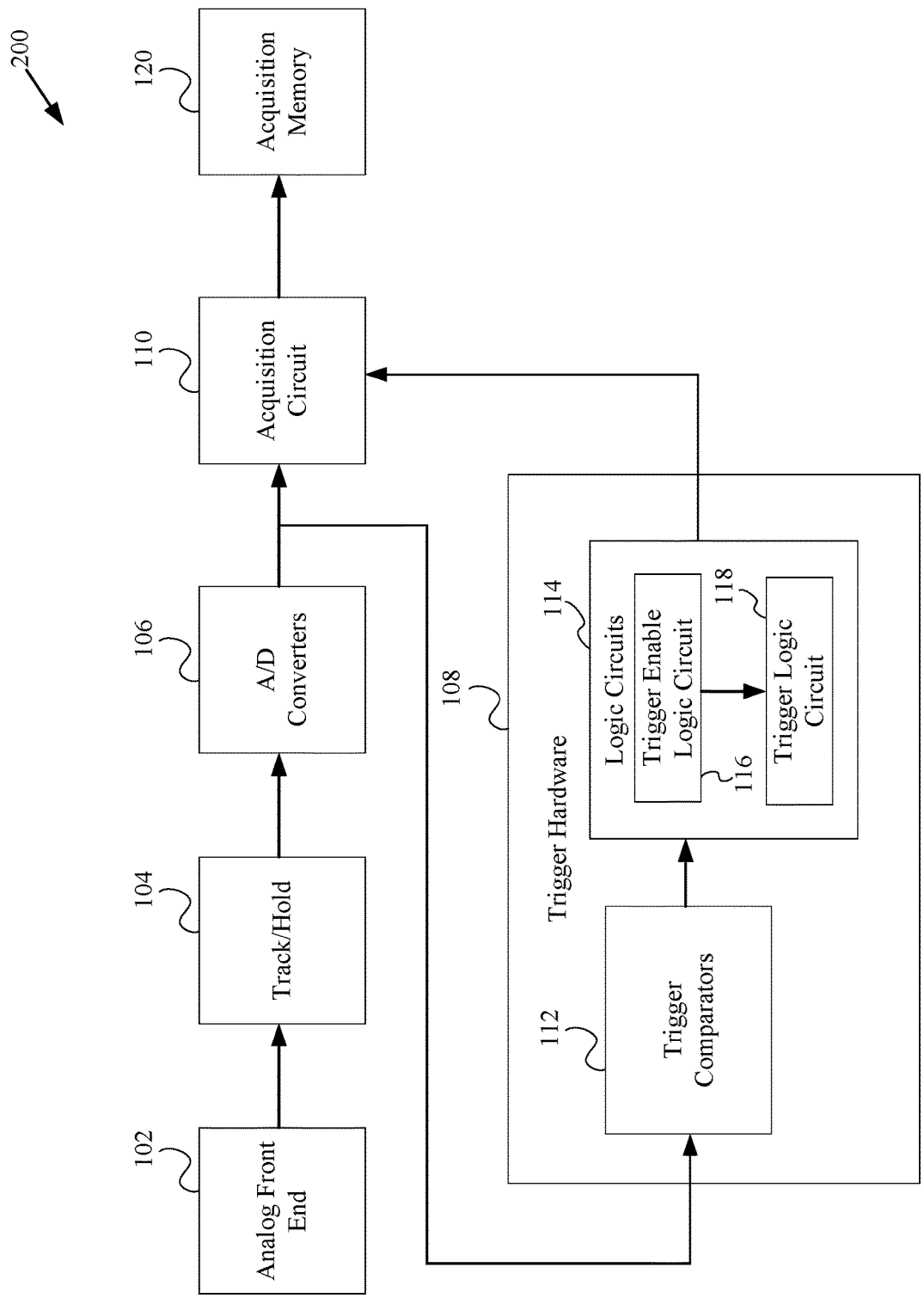
FIG. 2 is a block diagram of another example oscilloscope according to other embodiments of the disclosure.
Figure 3:
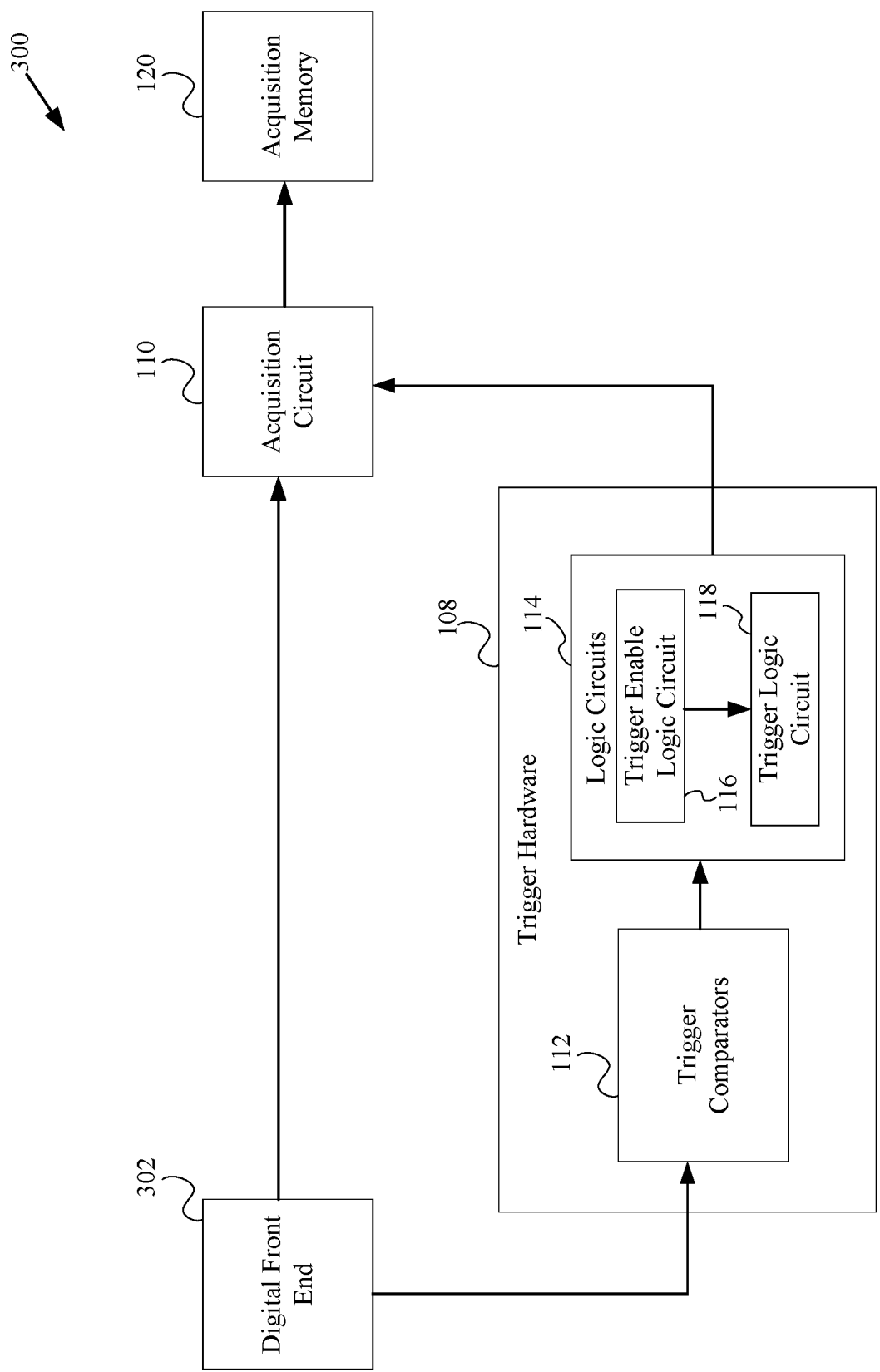
FIG. 3 is a block diagram of another example oscilloscope according to other embodiments of the disclosure.

FIGS. 2 and 3 display block diagrams of oscilloscopes 200 and 300 according to other embodiments of the present disclosure. FIGS. 2 and 3 are similar to FIG. 1 and like components are not further described herein. Rather than receiving an analog signal at comparators 112, as shown in FIG. 1, the comparators 112 may receive a digital signal of the track-and-hold samples from the ADC 106, as shown in FIG. 2. The comparators 112 then compare digital signals to predetermined events and send a signal to logic circuitry 114 if any of the signals meet the qualifications for the predetermined event.

In FIG. 3, the oscilloscope 300 includes a digital front end 302, rather than an analog front end 102, and the output of the digital front end 302 is sent directly to the comparators 112 to determine if a predetermined event has occurred on any of the received digital signals. That is, the trigger hardware 108 may be used to enable a trigger and trigger on both analog and digital signals.

Figure 4:
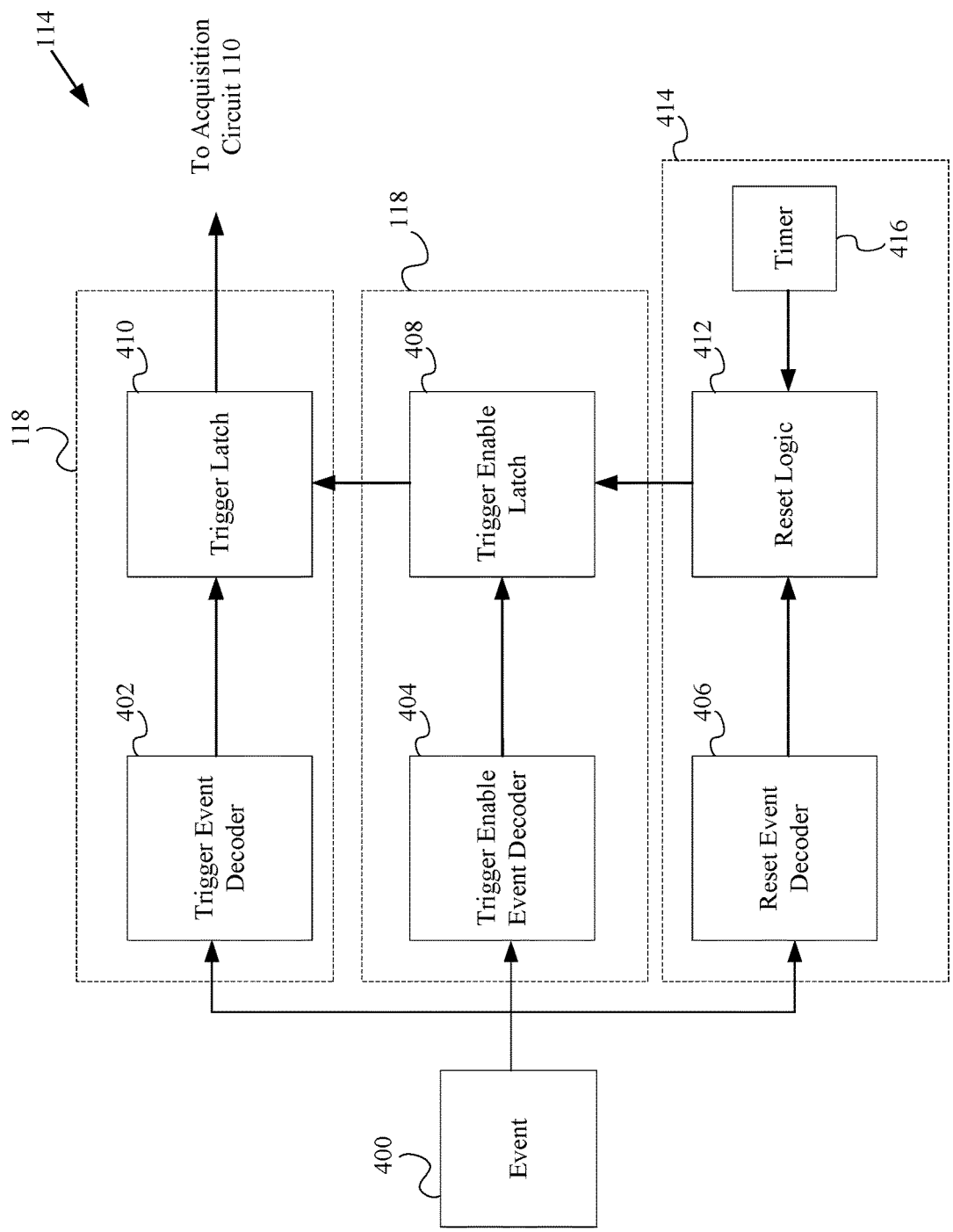
FIG. 4 is a block diagram of an example trigger hardware of any one of FIGS. 1-3 according to some embodiments of the disclosure.

FIG. 4 illustrates an example block diagram of the logic circuits 114 of FIGS. 1-3. When the comparators 114 determine an event 400 has occurred, the event 400 is sent to the trigger event decoder 402, the trigger enable event decoder 404, and the reset event decoder 406. Each of the decoders 402, 404, and 406 determines if the event qualifies as either a trigger event, a trigger enable event, or a reset event, respectively.

When a trigger enable event is detected by trigger enable event decoder 404, the trigger enable latch 408 outputs a trigger enabled signal to the trigger latch 410. The trigger enable event may include an edge detection event, a pulse greater than or less than a given width event, the detection of a signal of a given frequency event, the detection of a specific amplitude of a pulse event, etc. The trigger enable signal enables the trigger latch 410 to latch when the trigger event decoder 402 determines an event qualifies as a trigger event. An output from the trigger latch 410 is sent to the acquisition circuit 110 to acquire data related to the one or more digital samples from the ADC 106, such as a portion of the one or more digital samples, a timestamp, an error rate, a frequency, or other derived data. If the trigger event decoder 402 determines an event qualifies as a trigger but the trigger enable signal has not been received at the trigger latch 410, the trigger event is discarded and a signal is not sent to the acquisition circuit 110.

The trigger enable latch 408 may be reset by reset logic 412 in reset logic circuitry 414 if a reset event is determined by the reset event decoder 406. The reset logic 412 may also reset the trigger enable latch 408 based on a timer 416. However, as long as the trigger enable signal is present at the trigger latch 410, the trigger latch 410 will continue to send a signal to the acquisition circuit 110 each time a trigger event is decoded by the trigger event decoder 402. That is, once a trigger enable event is detected, the trigger enable latch 408 stays latched until instructed to reset by reset logic 412. This allows the oscilloscope to continuously run, but only begin triggering when a trigger enable signal is received.

Although FIG. 4 illustrates a single trigger logic circuit 118, the trigger logic circuit 118 may contain various other components to implement a variety of advanced trigger functions. As would be understood by one skilled in the art, the trigger logic circuit 118 may be able to trigger on simple or advanced trigger functionalities, and is not limited to a single trigger event, but may include a combination of events. For example, the trigger event may include an A-to-B-event sequence trigger, such that a trigger signal is sent to acquisition circuit 110 when an "A"-event followed by a "B"-event occurs. Examples of various triggers for the trigger event include edge, glitch, runt, pulse width, level, pattern, state, setup & hold violation, logic-qualified, timeout, predetermined window, a predetermined period, time-qualified transition, time-qualified pattern, and/or serial data triggering, with or without additional post-processing trigger qualifications, such as a visual trigger. In some embodiments, multiple trigger logic circuits 118 may be present. That is, when the trigger enable signal is present, the oscilloscope may acquire a signal every time an "A"-event happens followed by a "B"-event.

The trigger hardware 108 discussed above with respect to FIGS. 1-4 may be integrated in single, stand-alone oscilloscopes, as well as multi-oscilloscope stacks. For example, a four-oscilloscope stack may acquire signals on a channel of 200 Gs/s waveforms on each of the four oscilloscopes simultaneously, while triggering on other signals input into additional channels on the master oscilloscope in the stack. The trigger may be enabled by a trigger enable event on a signal in another channel of the master oscilloscope. The trigger hardware 108 may also be used with a variety of acquisition modes, since the trigger enable signal enables the triggering function. Therefore, it may be used with single-step, continuous run, fast-frame, and fast-acquisition modes, which may improve selective waveform capture in a wide-variety of test and measurement situations, ranging from system debugging to automated testing.

As an example, a field programmable gate array (FPGA) designer may need to trigger and capture a continuously emitted signal only when a state machine is in a given state. A simple rising edge signal may be routed from the FPGA to a test point to enable the trigger when the state is entered and disable the trigger when the state exits. A continuously emitted signal then supplies trigger events to the real-time oscilloscope for waveform capture through the acquisition circuit 110, only when the state machine is in the desired state, as determined by the trigger enable logic circuit 116.

Figure 5:
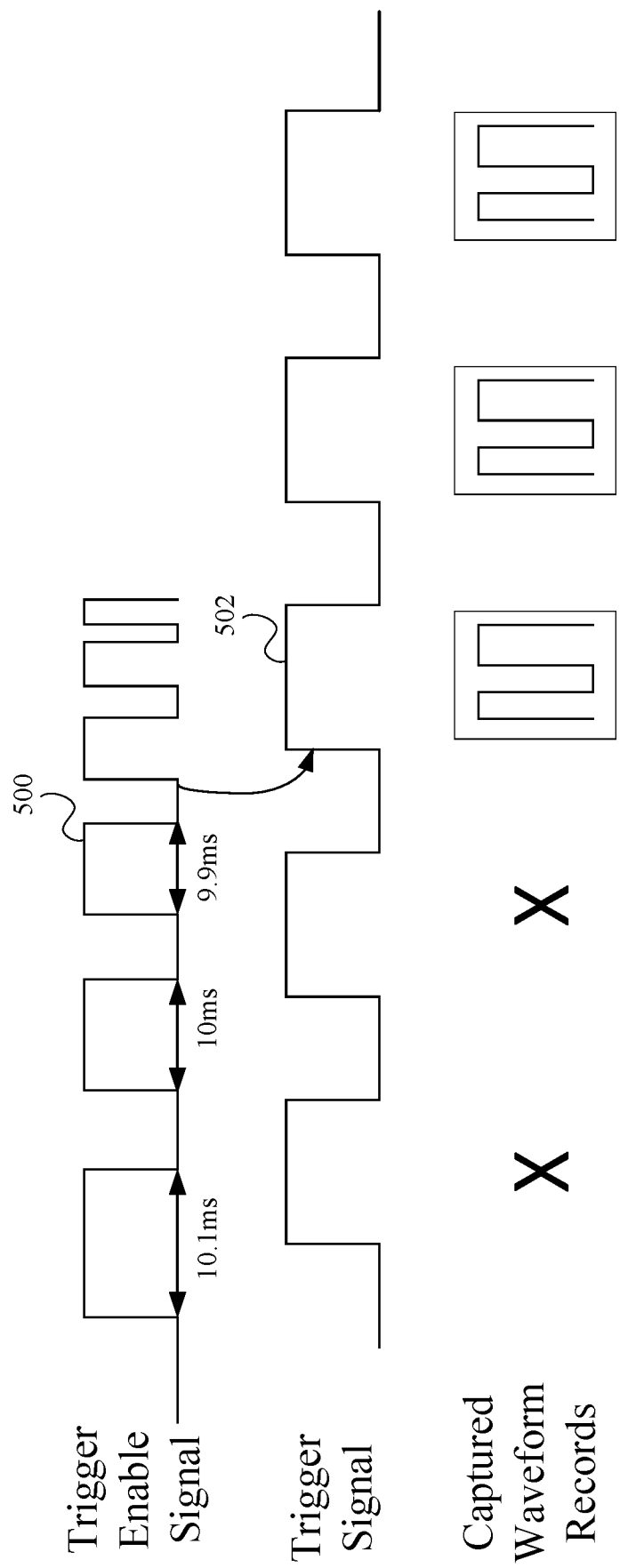
FIG. 5 is an example of a timing diagram of trigger hardware of FIG. 4 according to some embodiments of the disclosure.

FIG. 5 illustrates another example of trigger enabling. FIG. 5 illustrates signals received from a pulse-width modulated motor system. The pulse-width modulated motor system may include various signals that need to be monitored by the oscilloscope, but only when the pulse-width modulation is within a given frequency range.

For example, as seen in FIG. 5, the trigger is enabled only when the pulse-width of the pulse-width modulated signal is less than 10 ms. When the trigger enable event 500 of a pulse-width of less than 10 ms is detected, the oscilloscope begins triggering at the first pulse on the trigger signal after the trigger enable event 502, and data is captured for each trigger event thereafter, until a reset event occurs, as discussed above. However, no acquisitions are acquired when trigger events occur prior to the trigger enable event.

Figure 6:
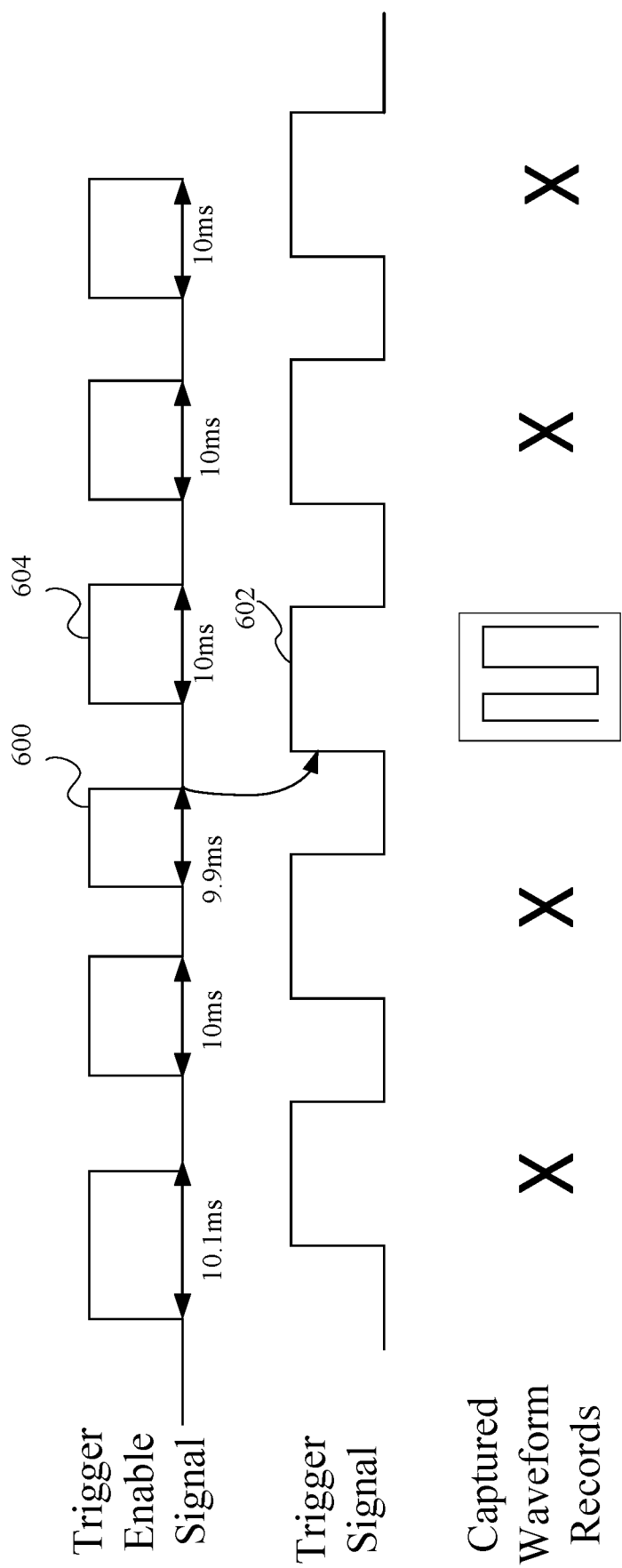
FIG. 6 is another example of a timing diagram of trigger hardware of FIG. 4 according to some embodiments of the disclosure.

FIG. 6 illustrates another example of trigger enabling. FIG. 6 is similar to the example shown in FIG. 5 and illustrates signals received from a pulse-width modulated motor system. Similar to FIG. 5, a trigger is enabled only when the pulse-width modulated signal is less than 10 ms.

As seen in FIG. 6, pulse 600 is less than 10 ms, and so a waveform record is captured at the next trigger signal 602. However, in FIG. 6, the pulse 604 following pulse 600 pulse-width modulated motor signal has returned to 10 ms. The reset logic 412 determines that a reset even has occurred (pulse-width modulated signal 10 ms or great) and resets the trigger enable logic circuit 116 so that the trigger enable signal is no longer output and the instrument does not trigger on the next trigger event. As seen in FIG. 6, only one waveform record is captured since only a single trigger enable event occurred before a reset even occurred.

Figure 7:
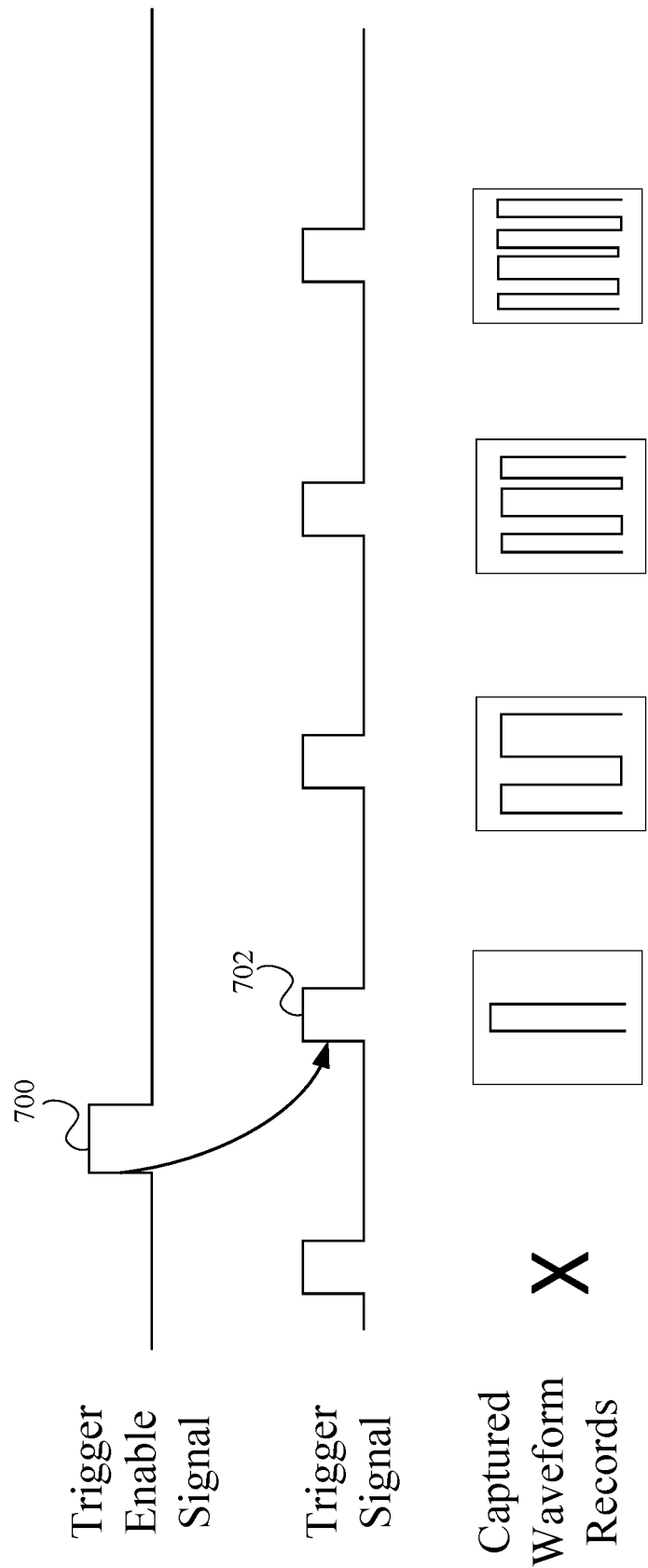
FIG. 7 is another example of a timing diagram of trigger hardware of FIG. 4 according to some embodiments of the disclosure.

FIG. 7 illustrates another example of trigger enabling. An optical test system may switch a signal into a long fiber recirculating loop and use a fast-frame acquisition mode to capture the signal during each transit of the loop to determine the signal quality characteristics over time. A pulse 700 may be emitted by an optical control system when a switch is thrown and this may be used to enable the trigger of the oscilloscope, with a prescribed dwell period as the optical signal is circulating through the loop. A trigger event 702 on a second signal may be used as the trigger. The trigger event may be emitted on a timed basis to capture fast-frame waveforms on each signal transit around the loop. That is, the oscilloscope begins triggering on the first trigger event 702 after the trigger enable event 700. Data is captured based on each trigger event. In some embodiments, a portion of a waveform may be captured, multiple portions of a waveform may be captured, a timestamp, an error rate, a frequency, and/or other derived data. While multiple portions of the waveform are captured, a user may be able to compare the first capture and/or frame of the first transit through the loops with the first capture and/or frame of a second transit through the loop, which may provide useful information to a user.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), programmable logic controllers, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples of the disclosure may operate on a particularly created hardware, on firmware, digital signal processors, or on a specially programmed general-purpose computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one skilled in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described regarding a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is an oscilloscope including one or more ports to receive one or more signals from one or more devices, at least one of the one or more devices being a device under test; a trigger enable logic circuit configured to output a trigger enabled signal when a trigger enable event occurs within the one or more signals, the trigger enable event being a real-time event of the one or more signals; one or more trigger logic circuits configured to generate a plurality of trigger signals when the trigger enable signal is received, each trigger signal being generated after a trigger event occurs within one of the one or more signals; and an acquisition circuit configured to acquire and store data in a memory in response to each of the trigger signals.

Example 2 is the oscilloscope of Example 1, in which the one or more ports include a first port to receive a first signal from the device under test, a second port to receive a second signal from the device under test, and a third port to receive a third signal from the device under test, the trigger enable logic circuit is further configured to generate the trigger enabled signal when the trigger enable event occurs within the first signal, the one or more trigger logic circuits is further configured to generate a plurality of trigger signals, each trigger signal being generated when the one or more trigger comparators determines a trigger event occurs within the second signal; and an acquisition circuit is further configured to acquire and store in a memory a portion of the third signal in response to each of the trigger signals.

Example 3 is the oscilloscope of Example 1, wherein the data stored in memory includes a portion of the one or more signals, a timestamp, an error rate, or a frequency.

Example 4 is the oscilloscope of Example 1, further comprising a reset circuit to output a reset signal in response to a reset condition to the trigger enable logic circuit to reset the trigger enable logic circuit so that the trigger enable signal will not output until another trigger enable event occurs within the one or more signals.

Example 5 is the oscilloscope of Example 4, wherein the reset condition includes a receiving a timer signal from a timer or detecting a reset event within one of the one or more signals.

Example 6 is the oscilloscope of Example 1, wherein the trigger event includes a first event followed by a second event.

Example 7 is the oscilloscope of Example 1, wherein the trigger enable event includes an edge detection event, a pulse greater than or less than a given width event, a detection of a signal of a given frequency event, or a detection of a specific amplitude of a pulse event.

Example 8 is a method for acquiring a plurality of portions of one or more signals in response to a plurality of triggering events in an oscilloscope, including receiving one or more signals from a device under test; generating a trigger enable signal when a trigger enable event is detected within one of the one or more signals, the trigger enable event including a real-time event of the one or more signals; after the initialization signal is generated, generating a plurality of trigger signals each time a trigger event is detected within one of the one or more signals; acquiring data for each trigger signal; and storing the data in a memory.

Example 9 is the method of Example 8, wherein the trigger enable signal is generated when the trigger enable event is detected within a first signal, the trigger signal is generated when a trigger event is detected within a second signal, and the acquired portion is a portion of a third signal.

Example 10 is the method of Example 8, further comprising resetting the trigger enable signal when a reset condition occurs.

Example 11 is method of Example 8, wherein the data includes a portion of the one or more signals, a timestamp, an error rate, or a frequency.

Example 12 is the method of Example 10, wherein the reset condition includes receiving a timer signal from a timer or detecting a reset event within one of the one or more signals.

Example 13 is the method of Example 8, wherein the trigger event includes a first event followed by a second event.

Example 14 is the method of Example 13, wherein the first event and the second event are detected within different signals.

Example 15 is the method of Example 8, wherein the trigger enable event includes an edge detection event, a pulse greater than or less than a given width event, a detection of a signal of a given frequency event, or a detection of a specific amplitude of a pulse event.

Example 16 is a computer readable storage medium having instructions stored thereon that, when executed by a processor of a test and measurement instrument, cause the test and measurement instrument to receive one or more signals from a device under test; generate a trigger enable signal when a trigger enable event is detected within one of the one or more signals; after the trigger enable signal is generated, generate a plurality of trigger signals each time a trigger event is detected within one of the one or more signals; acquire data for each trigger signal; and store the data in a memory.

Example 17 is the computer readable storage medium of Example 16, wherein the trigger enable signal is generated when the trigger enable event is detected within a first signal, the trigger signal is generated when a trigger event is detected within a second signal, and the acquired portion is a portion of a third signal.

Example 18 is the computer readable storage medium of Example 16, further including instructions stored thereon that, when executed by the processor of the test and measurement instrument, cause the test and measurement instrument to reset the trigger enable signal when a reset condition occurs.

Example 19 is the computer readable storage medium of Example 16, wherein the data includes a portion of the one or more signal, a timestamp, an error rate, or a frequency.

Example 20 is the computer readable storage medium of Example 16, wherein the trigger enable event includes an edge detection event, a pulse greater than or less than a given width event, a detection of a signal of a given frequency event, or a detection of a specific amplitude of a pulse event.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. An oscilloscope, comprising:
   one or more ports to receive one or more signals from one or more devices, at least one of the one or more devices being a device under test;
   a trigger enable logic circuit configured to assert a trigger enabled signal when a trigger enable event occurs within the one or more signals, the trigger enable event being a real-time event of the one or more signals in which a pulse width of one of the one or more signals is less than a threshold width;
   one or more trigger logic circuits configured to generate a plurality of trigger signals when the trigger enable signal is asserted, each trigger signal being generated after a trigger event occurs within one of the one or more signals; and
   an acquisition circuit configured to acquire and store data in a memory in response to each of the trigger signals.

2. The oscilloscope of claim 1, in which the one or more ports include a first port to receive a first signal from the device under test, a second port to receive a second signal from the device under test, and a third port to receive a third signal from the device under test,
   the trigger enable logic circuit is further configured to generate the trigger enabled signal when the trigger enable event occurs within the first signal,
   the one or more trigger logic circuits is further configured to generate a plurality of trigger signals, each trigger signal being generated when the one or more trigger comparators determines a trigger event occurs within the second signal; and
   the acquisition circuit is further configured to acquire and store in a memory a portion of the third signal in response to each of the trigger signals.

3. The oscilloscope of claim 1, wherein the data stored in memory includes a portion of the one or more signals, a timestamp, an error rate, or a frequency.

4. The oscilloscope of claim 1, further comprising a reset circuit to output a reset signal in response to a reset condition to the trigger enable logic circuit to reset the trigger enable logic circuit so that the trigger enable signal will not assert until another trigger enable event occurs within the one or more signals.

5. The oscilloscope of claim 4, wherein the reset condition includes a receiving a timer signal from a timer or detecting a reset event within one of the one or more signals.

6. The oscilloscope of claim 1, wherein the trigger event includes a first event followed by a second event.

7. The oscilloscope of claim 1, wherein the trigger enable event further includes an edge detection event, a pulse greater than a given width event, a detection of a signal of a given frequency event, or a detection of a specific amplitude of a pulse event.

8. A method for acquiring a plurality of portions of one or more signals in response to a plurality of triggering events in an oscilloscope, comprising:
   receiving one or more signals from a device under test;
   generating a trigger enable signal when a trigger enable event is detected within one of the one or more signals, the trigger enable event including a real-time event of the one or more signals in which a pulse width of one of the one or more signals is less than a threshold width;
   after the trigger enable signal is generated, generating a plurality of trigger signals each time a trigger event is detected within one of the one or more signals;
   acquiring data for each trigger signal; and
   storing the data in a memory.

9. The method of claim 8, wherein the trigger enable signal is generated when the trigger enable event is detected within a first signal, the trigger signal is generated when a trigger event is detected within a second signal, and the acquired portion is a portion of a third signal.

10. The method of claim 8, further comprising resetting the trigger enable signal when a reset condition occurs.

11. The method of claim 8, wherein the data includes a portion of the one or more signals, a timestamp, an error rate, or a frequency.

12. The method of claim 10, wherein the reset condition includes receiving a timer signal from a timer or detecting a reset event within one of the one or more signals.

13. The method of claim 8, wherein the trigger event includes a first event followed by a second event.

14. The method of claim 13, wherein the first event and the second event are detected within different signals.

15. The method of claim 8, wherein the trigger enable event further includes an edge detection event, a pulse greater than or less than a given width event, a detection of a signal of a given frequency event, or a detection of a specific amplitude of a pulse event.

16. A computer readable storage medium having instructions stored thereon that, when executed by a processor of a test and measurement instrument, cause the test and measurement instrument to:
  receive one or more signals from a device under test;
  generate a trigger enable signal when a trigger enable event is detected within one of the one or more signals, the trigger enable event being a real-time event of the one or more signals in which a pulse width of one of the one or more signals is less than a threshold width;
  after the trigger enable signal is generated, generate a plurality of trigger signals each time a trigger event is detected within one of the one or more signals;
  acquire data for each trigger signal; and
  store the data in a memory.

17. The computer readable storage medium of claim 16, wherein the trigger enable signal is generated when the trigger enable event is detected within a first signal, the trigger signal is generated when a trigger event is detected within a second signal, and the acquired portion is a portion of a third signal.

18. The computer readable storage medium of claim 16, further including instructions stored thereon that, when executed by the processor of the test and measurement instrument, cause the test and measurement instrument to reset the trigger enable signal when a reset condition occurs.

19. The computer readable storage medium of claim 16, wherein the data includes a portion of the one or more signal, a timestamp, an error rate, or a frequency.

20. The computer readable storage medium of claim 16, wherein the trigger enable event further includes an edge detection event, a pulse greater than or less than a given width event, a detection of a signal of a given frequency event, or a detection of a specific amplitude of a pulse event.

* * * * *